US006993297B2

(12) United States Patent
Smith, Jr.

(10) Patent No.: US 6,993,297 B2
(45) Date of Patent: Jan. 31, 2006

(54) APPARATUS AND METHODS FOR TUNING ANTENNA IMPEDANCE USING TRANSMITTER AND RECEIVER PARAMETERS

(75) Inventor: Edward Lee Smith, Jr., Raleigh, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 559 days.

(21) Appl. No.: 10/194,117

(22) Filed: Jul. 12, 2002

(65) Prior Publication Data

US 2004/0009754 A1   Jan. 15, 2004

(51) Int. Cl.
  *H04B 1/46*   (2006.01)
(52) U.S. Cl. .................. 455/82; 455/129; 455/121; 455/248.1
(58) Field of Classification Search ............. 455/180.3, 455/179.1, 107, 115.2, 127, 126, 82, 129, 455/121
See application file for complete search history.

(56) References Cited

U.S. PATENT DOCUMENTS

| | | | |
|---|---|---|---|
| 4,380,767 A | | 4/1983 | Goldstein et al. ............ 343/745 |
| 4,799,066 A | | 1/1989 | Deacon ....................... 343/861 |
| 5,430,411 A | * | 7/1995 | Boulic ......................... 330/284 |
| 5,697,081 A | | 12/1997 | Lyall, Jr. et al. .......... 455/249.1 |
| 5,913,154 A | * | 6/1999 | Wynn ...................... 455/127.2 |
| 6,026,280 A | * | 2/2000 | Yokomura ................... 455/78 |
| 6,272,327 B1 | | 8/2001 | Kurchuk et al. ............. 455/217 |
| 6,297,696 B1 | * | 10/2001 | Abdollahian et al. ... 330/124 R |
| 6,526,263 B1 | * | 2/2003 | Saito ............................. 455/78 |
| 6,566,944 B1 | * | 5/2003 | Pehlke et al. .................. 330/10 |
| 6,621,365 B1 | * | 9/2003 | Hallivuori et al. .......... 331/179 |
| 6,813,481 B1 | * | 11/2004 | Ide .............................. 455/129 |
| 6,845,126 B2 | * | 1/2005 | Dent et al. ................... 375/219 |
| 6,868,260 B2 | * | 3/2005 | Jagielski et al. ............. 455/107 |
| 2005/0042994 A1 | * | 2/2005 | Otaka et al. ............. 455/180.3 |

FOREIGN PATENT DOCUMENTS

| | | |
|---|---|---|
| EP | 0813311 A2 | 12/1997 |
| JP | 03119836 | 10/1989 |
| JP | 11251956 | 9/1999 |

OTHER PUBLICATIONS

International Search Report for International Application Serial No. PCT/US03/18894; dated Oct. 22, 2003.

* cited by examiner

*Primary Examiner*—Tilahun Gesesse
*Assistant Examiner*—Tan Trinh
(74) *Attorney, Agent, or Firm*—Myers Bigel Sibley & Sajovec, PA

(57) ABSTRACT

According to some embodiments of the present invention, an impedance transformation circuit is provided for use with a transmitter, a receiver, and an antenna. The transmitter may provide transmission signals for transmission by the antenna. The antenna may provide received signals having an associated signal parameter to the receiver. The impedance transformation circuit includes an impedance adjusting circuit and a controller. The impedance adjusting circuit is connected between the antenna, the receiver, and the transmitter. The impedance adjusting circuit is configured to change an impedance difference presented between at least one of: 1) the transmitter and the antenna, and 2) the antenna and the receiver, in response to a control signal. The controller generates the control signal to change the presented impedance difference in response to a signal parameter.

23 Claims, 3 Drawing Sheets

APPARATUS AND METHODS FOR TUNING ANTENNA IMPEDANCE USING TRANSMITTER AND RECEIVER PARAMETERS

FIELD OF THE INVENTION

The present invention relates generally to wireless communication apparatus and methods, and more particularly to adjusting the impedance presented to a transmitter, receiver, and antenna in a wireless communication apparatus.

BACKGROUND OF THE INVENTION

Wireless communications apparatus often include a transmitter, a receiver, and an antenna. Information signals can be encoded and amplified by the transmitter and transferred to the antenna for radiation to the environment. Information signals received by the antenna can be transferred to the receiver where they can be decoded and amplified. Impedance mismatches between the transmitter and the antenna or between the antenna and receiver can cause reflection of transmitted signals or received signals, respectively, and an associated loss of power in the transferred signals. Efficient power transfer of transmission signals can occur when the impedance presented between the transmitter and the antenna are about equal (i.e., matched). Similarly, efficient power transfer of received signals can occur when the impedance between the antenna and the receiver are about equal.

Conventional solutions for providing efficient power transfer include matching the impedance of the transmitter and antenna and/or matching the impedance of the receiver and antenna during manufacturing of the communications apparatus. During use, however, the impedances of the antenna, transmitter, and receiver may change, resulting in impedance mismatches.

Impedance mismatches may be caused, for example, by motion of the communications apparatus and/or the presence of reflective or shielding objects in its operating environment. When impedances are matched for one frequency band, they can become mismatched during operation in other frequency bands. Such a mismatch can become particularly apparent for communications apparatus that operate in multiple frequency bands, such as those provided for Global System for Mobile Communication (GSM), Digital Communications System (DCS), Advanced Mobile Phone Services (AMPS), Personal Communication Services (PCS), or wireless local area network (WLAN). Moreover, miniaturization of communications apparatus and the use of small antennas, such as patch antennas, can increase the variation of the impedance of the antenna, transmitter, and receiver as a function of frequency.

When the transmitter and receiver share an antenna, adjusting the impedance match between the transmitter and the antenna can affect the impedance match between the receiver and the antenna and vice versa.

For such apparatus, impedance mismatch may cause unacceptable power loss in signals transmitted or received as the apparatus operates between transmit and receive frequency ranges and between frequency bands.

SUMMARY OF THE INVENTION

According to some embodiments of the present invention, an impedance transformation circuit is provided for use with a transmitter, a receiver, and an antenna. The transmitter provides transmission signals for transmission by the antenna. The antenna provides received signals having an associated signal parameter to the receiver. The impedance transformation circuit includes an impedance adjusting circuit and a controller. The impedance adjusting circuit is connected between the antenna, the receiver, and the transmitter. The impedance adjusting circuit is configured to change an impedance difference presented between one or more of: 1) the transmitter and the antenna, and 2) the antenna and the receiver. The change is in response to a control signal. The controller generates the control signal to change the presented impedance difference in response to the signal parameter.

In some embodiments, the signal parameter is indicative of an amount of power reflected in the received signal. The controller may reduce the presented impedance difference between the antenna and the receiver when the reflected power does not satisfy a threshold value and/or reduce the presented impedance difference between the transmitter and the antenna when the reflected power satisfies the threshold value.

In other embodiments, the signal parameter is indicative of a received signal strength of the received signal. The controller may reduce the presented impedance difference between the antenna and the receiver when the received signal strength does not satisfy a threshold value and/or reduce the presented impedance difference between transmitter and antenna when the received signal strength satisfies a threshold value.

In other embodiments, the signal parameter is indicative of a bit error rate of the received signal. The controller may reduce the presented impedance difference between the antenna and the receiver when the bit error rate does not satisfy a threshold value and/or reduce the presented impedance difference between transmitter and antenna when the bit error rate satisfies a below value.

In other embodiments, the signal parameter is indicative of when the receiver is actively receiving signals and/or the transmitter is actively transmitting signals. The controller may reduce the presented impedance difference between the antenna and the receiver when the receiver is active and/or reduce the presented impedance difference between transmitter and antenna when the transmitter is active.

In this manner, the impedance transformation circuit may adjust the impedances in response to one or more static or time-varying parameters associated with received signals and/or transmitted signals. Further, the performance of the transmitter or receiver may be selectively improved as will be described in the following detailed description.

DETAILED DESCRIPTION

The present invention will now be described more fully with reference to the accompanying drawings, in which typical embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

According to some embodiments of the present invention, impedance transformation circuits and methods may be provided. FIGS. 1–4 illustrate exemplary apparatus and methods according to embodiments of the present invention. It will be understood that operations depicted in the figures, and combinations thereof, may be implemented using one or more electronic circuits. It will also be appreciated that, in general, operations depicted in the diagrams, and combinations thereof, may be implemented in one or more electronic circuits, such as in one or more discrete electronic components, one or more integrated circuits (ICs) and/or one or more application specific integrated circuits (ASICs) and/or application specific circuit modules, as well as by computer program instructions which may be executed by a computer or other data processing apparatus, such as a microprocessor or digital signal processor (DSP), or combinations or hardware and computer instructions, all of which are referred to herein as "circuits."

Figure 1:
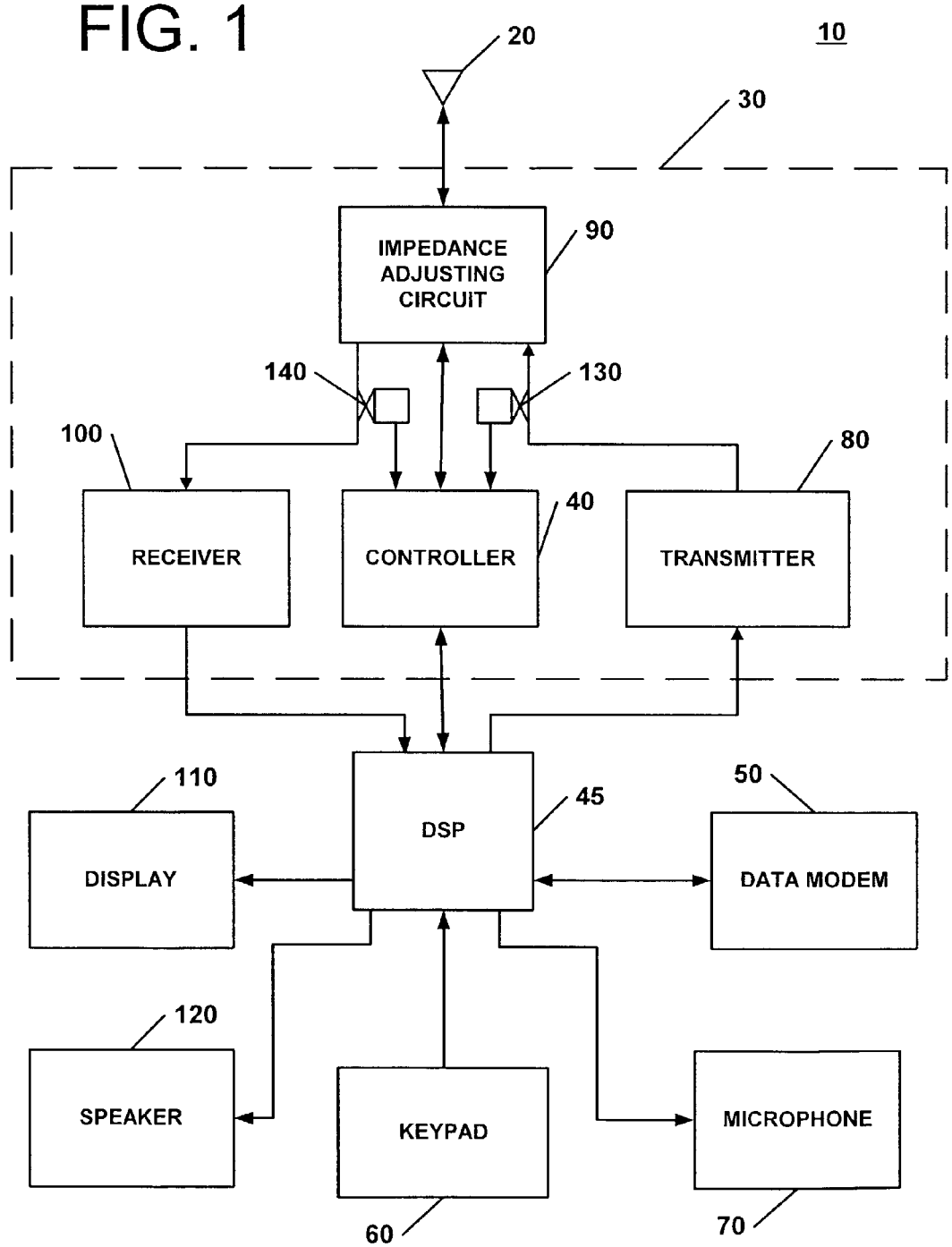
FIG. 1 illustrates a block diagram of a transceiver according to some embodiments of the present invention.
Figure 2:
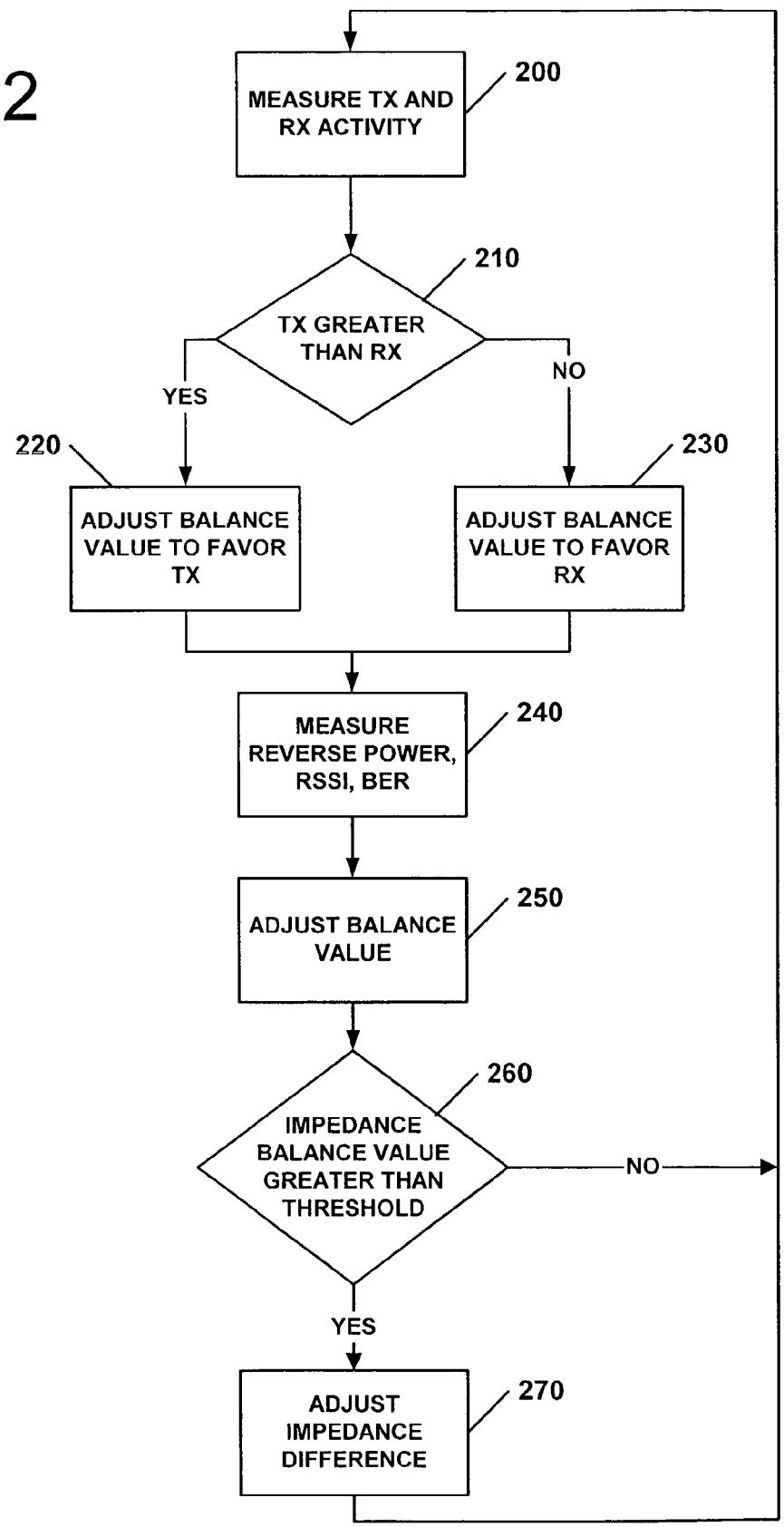
FIG. 2 illustrates impedance transformation operations for a transceiver according to some embodiments of the present invention.

FIG. 1 is a block diagram of a wireless mobile terminal 10 according to the embodiments present invention. As used herein, the term "mobile terminal" may include, but is not limited to, a cellular wireless terminal; a personal communication terminal that may combine a cellular wireless terminal with data processing, facsimile and data communications capabilities; a personal data assistance (PDA) that can include a wireless terminal, pager, Internet/intranet access, local area network interface, wide area network interface, Web browser, organizer, calendar and/or a global positioning system (GPS) receiver; and a mobile or fixed computer or other device that includes a wireless terminal transceiver. Although the invention is illustrated for use with a mobile terminal, it will be understood that the invention is applicable to any wireless communications system such as cellular, trunked radio, satellite, and other wireless communications infrastructure.

The mobile terminal 10 can be used to transmit and receive information signals with another mobile terminal or a wireless communications system. As illustrated in FIG. 1, the mobile terminal 10 includes an antenna 20, a transceiver 30, and a digital signal processor (DSP) 45. The DSP 45 is coupled to the transceiver 30 to process digital communications signals. The transceiver 30 illustrated in FIG. 1 includes a controller 40, a receiver 100, a transmitter 80, and an impedance adjusting network 90.

Information signals can be provided by a data modem 50, keypad 60, or microphone 70 to the DSP 45 for transmission. The DSP 45 prepares the information signals for transmission, using, for example, conventional encoding processes. The information signals are provided to the transmitter 80 where the information signals can be, for example, converted to analog signals, modulated with a carrier signal, amplified, and provided to the antenna 20 to be radiated from the mobile terminal 10. The signal path between the transmitter 80 and the antenna 20 may also be referred to as the transmission path.

Information signals received by the antenna 20 are provided to the receiver 100 where they are amplified, demodulated to a baseband frequency, decoded, converted to digital signals, and provided to the DSP 45 for processing. The signal path between the antenna 20 and the receiver 100 may also be referred to as the reception path. The DSP 45 may provide the received information signals, for example, to a display 110, a speaker 120, and/or the data modem 50. It will be understood that the transceiver 30 can include other components such as proved in conventional transceivers, which conventional aspect of which are not shown or further described herein.

During transmission of an information signal, efficient transfer of information signal power from the transmitter 80 to the antenna 20 may occur when the impedances of the transmitter 80 and antenna 20 are substantially the same (i.e., the impedances are matched). Impedance differences may lead to a portion of the signal power being reflected, or reversed, by the antenna 20 back to the transmitter 80 instead of being radiated through the antenna 20. Generally, the greater the impedance difference, the greater the loss of signal power due to reflections at the antenna 20 back to the transmitter 80.

Similarly, during reception of an information signal, efficient transfer of information signal power from the antenna 20 to the receiver 100 may occur when the impedance differences are matched. Generally, the greater the impedance difference, the greater the loss of signal power due to reflections at the receiver 100 back to the antenna 20.

According to some embodiments of the present invention, the impedance adjusting network 90 is connected to the signal paths between the transmitter 80 and the antenna 20 and between the antenna 20 and the receiver 100 to adjust the impedances presented between the transmitter 80 and the antenna 20 and/or the receiver 100 and the antenna 20 in response to an impedance control signal 95 from the controller 40. The controller 40 monitors one or more static or time-varying parameters associated with the transmission or reception of information signals and adjusts the impedance control signal 95 to cause the impedance adjusting network 90 to adjust the impedances and, thereby, the transmission power transfer efficiency and/or reception power transfer efficiency. Improving the efficiency of power transfer during transmission and/or reception may improve the sensitivity of the transmitter and/or receiver, respectively. In this manner, the efficiency of the transmitter 80 or receiver 100 may be selectively improved, or optimized, in response to the one or more static or time-varying signal parameters. Although the controller 40 is shown as a separate functional block from the DSP 45 and the impedance adjusting network 90, its functionality may be integrated within the DSP 45 and/or the impedance adjusting network 90.

In some embodiments of the present invention, the controller 40 is connected to a transmit power detector 130 and a receive power detector 140. The transmit power detector 130 and the receive power detector 140 sense the amount of forward signal power and reverse signal power (i.e., reflected power) provided in the transmission path and reception path, respectively, and provide the sensed information to the controller 40. The controller 40 may adjust the impedance differences in the transmission path and/or reception path in response to a comparison of one or both of the sensed reverse power amounts, or a ratio of sensed reverse and forward power amounts, to a predetermined threshold value(s).

For example, when the reflected power in the transmission path does not satisfy (e.g., is greater than) a predetermine threshold value the controller 40 may reduce, or substantially eliminate, an impedance difference in the transmission path to reduce any reflected power. Likewise, when the reflected power in the reception path does not satisfy (e.g., is greater than) a predetermine threshold value the controller 40 may reduce, or substantially eliminate, an impedance difference in the reception path to reduce any reflected power. The controller 40 may, alternatively, respond to the comparison of the reflected power values, or ratio of forward and reverse power values, to a predetermined threshold by providing a weighted balance of the amount of reflected power in the paths. In this manner, the controller 40 may improve reception power transfer efficiency when the transmission power transfer efficiency satisfies a threshold value (i.e., is acceptable) or may improve transmission power transfer efficiency when the reception power transfer satisfies a threshold value (i.e., is acceptable).

Because the antenna is shared by the transmission path and the reception path, impedances changes to the transmission path, to improve the power transfer efficiency thereof, cause a change to the impedance of the reception path, with a corresponding worsening of the power transfer efficiency thereof, and vice versa. Thus, such changes represent a balancing of the desired efficiencies of the transmission and reception paths.

In some other embodiments of the present invention, the DSP 45 measures the strength and/or bit error rate of information signals received from the antenna 20 and provides a received signal strength indication (RSSI) and/or bit error rate indication of a received signal to the controller 40. The controller 40 may then adjust the impedances of the transmission and reception paths in response to the RSSI and/or bit error rate indications.

For example, the controller 40 may reduce, or substantially eliminate, an impedance difference between the transmitter 80 and antenna 20 when the RSSI satisfies (e.g., is above) a threshold value. Similarly, the controller 40 may reduce, or substantially eliminate, an impedance difference between the antenna 20 and receiver 100 when the RSSI does not satisfy (e.g., is below) a threshold value. In this manner, the controller 40 may, for example, selectively improve the power transfer efficiency of the transmission or reception path to favor one over the other depending upon the strength of a received signal.

The controller 40 may, alternatively or additionally, reduce, or substantially eliminate, the impedance difference between the antenna 20 and receiver 100 when the bit error rate indication does not satisfy (e.g., is above) a threshold value. Similarly, the controller 40 may reduce, or substantially eliminate, the impedance difference between the transmitter 80 and antenna 20 when the bit error rate indication satisfies (e.g., is below) a threshold value. In this manner, the controller 40 may selectively improve the power transfer efficiency of the transmission or reception path depending upon the bit error rate of a received signal.

According to other embodiments of the present invention, an indication of transmission or reception activity is provided to the controller 40 by the transmit power detector 130, the receive power detector 140, and/or the DSP 45. The controller 40 may then reduce, or substantially eliminate, impedance differences between the transmitter 80 and antenna 20 when information signals are being transmitted, but not received. Conversely, impedance differences between the antenna 20 and receiver 100 may be reduced, or substantially eliminated, when information signals are being received, but not transmitted. In this manner, the power transfer efficiency from the transmitter 80 to the antenna 20 or between the antenna 20 and receiver 100 may be improved when needed. For example, because voice conversations through the mobile terminal 10 are generally simplex for a mobile radiotelephone, because only one user generally speaks at a time, the controller 40 can improve the transmission efficiency during voice transmission while improving the reception efficiency during voice reception.

According to some embodiments of the present invention, the controller 40 incrementally adjusts the impedance differences in the transmission path and reception path in response to a weighted consideration of more than one parameter associated with the transmitted and received signals, such as the amount of reflected power in one or both paths, RSSI, bit error rate, and transmission and reception activity. The operations for incrementally adjusting the impedance differences may include those shown in FIG. 2. At Block 200 the relative transmission (TX) activity and reception activity (RX) are measured. A determination is made at Block 210 whether the transmission activity is greater than the reception activity. When the determination is greater, an impedance balance value is adjusted, at Block 220, to favor the efficiency of the transmission path. When less, the impedance balance value is adjusted, at Block 230, to favor the efficiency of the reception path.

At Block 240, the reverse power (i.e., reflected power) in the transmission path may be sensed and/or the RSSI and/or BER may be sensed or received from the DSP 45. At Block 250, for some embodiments of the present invention, the impedance balance value is further adjusted in response to a weighted combination of more than one of the reverse power, RSSI, and BER.

At Block 260, a decision is made whether the impedance balance value satisfies (e.g., is greater) than a threshold value. The threshold value may represent, for example, a previous adjusted impedance balance value or a desired balance. At Block 270, when the impedance balance value is satisfied, a signal related to the impedance balance value is provided to the impedance adjusting network 90 to adjust the relative impedance differences of the transmission and reception paths. When the impedance balance value is not greater than the threshold, or upon completing Block 270, the flow of operations may return to Block 200 to measure the transmission and reception activity.

In this manner, the efficiency of the receiver 100 or transmitter 80 may be selectively improved. For example, the efficiency of the receiver 100 may be improved when the received signals have a sufficiently low RSSI, high BER, high reflected received signal power, and/or when the transmitter 80 is not transmitting signals. Similarly, the efficiency of the transmitter 80 may be improved when the receiver 100 is not receiving signals and/or when the received signals have a sufficiently high RSSI, low BER, and/or low reflected signal power. The impedance adjustments, and associated efficiencies of the transmitter 80 and the receiver 100, may be dynamically made to respond to time-varying operation conditions, such as changes to the wireless environment, operating frequencies, or signal interference from other sources.

Figure 3:
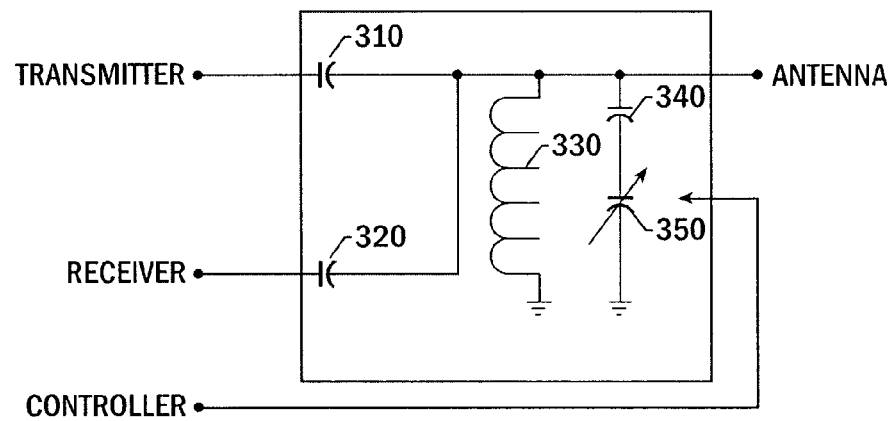
FIG. 3 illustrates a circuit diagram of an impedance adjusting network according to some embodiments of the present invention.

FIG. 3 shows an impedance adjusting network 90 according to some embodiments of the present invention. The illustrated impedance adjusting network 90 couples the output of the transmitter 80 through a capacitive load 310 to the antenna 20 and the input of the receiver 100 through a capacitive load 320 to the antenna 20. As shown in FIG. 3, a shunt network is connected between the capacitive loads 310 and 320 and the antenna 20. The illustrated shunt network includes an inductor 330 in parallel with a fixed-capacitance capacitor 340 and variable-capacitance capacitor 350. The capacitive loads 310 and 320 can include the capacitive loading of the transmission and reception paths, respectively. The inductance and capacitance of the inductor 330 and fixed capacitor 340 may be selected to provide a desired baseline impedance balance between the transmitter 80, receiver 100, and antenna 20. The capacitance of the variable capacitor 350 may be adjusted in response to an impedance control signal, such as an analog signal, from the controller 40, to adjust the impedance difference in the transmission and reception paths.

Figure 4:
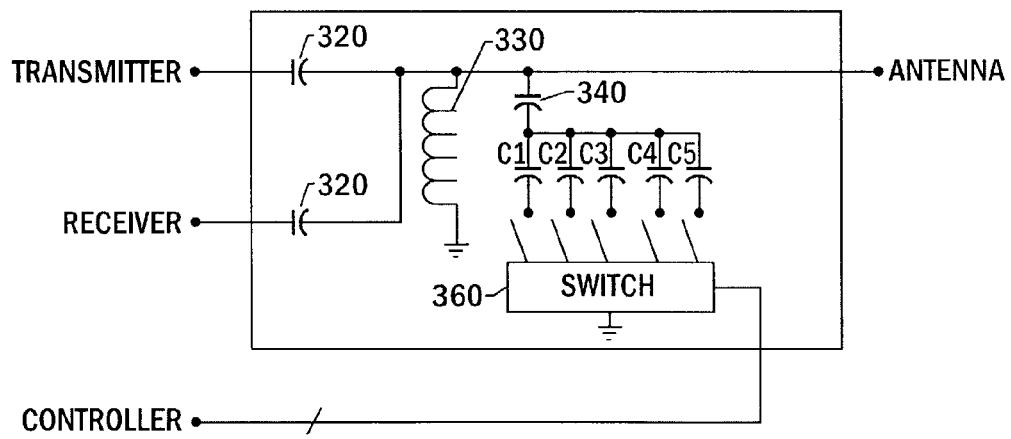
FIG. 4 illustrates a circuit diagram of an impedance adjusting network according to some other embodiments of the present invention.

FIG. 4 shows an impedance adjusting network 90 according to additional embodiments of the present invention. The network 90 differs from that of FIG. 3 in that the variable capacitor 350 of FIG. 3 is replaced with a digitally controllable capacitor 350 as shown in FIG. 4. The capacitor 350 can include a plurality of capacitors, C1–C5, connected in parallel, and a switch 360. The switch 360 selectively connects individual ones, or combinations, of the capacitors, C1–C5, to ground to adjust the capacitance in response to a digital impedance control signal from the controller 40.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. An impedance transformation circuit for use with a transmitter, a receiver, and an antenna, the transmitter providing a transmission signal for transmission by the antenna, the antenna providing a received signal having an associated signal parameter to the receiver, the impedance transformation circuit comprising:
   an impedance adjusting circuit between the antenna and receiver and transmitter, the impedance adjusting circuit being configured to selectively reduce the presented impedance difference between the transmitter and the antenna in response to a control signal and while the receiver is connected to the antenna, and to selectively reduce the presented impedance difference between the receiver and the antenna in response to the control signal and while the transmitter is connected to the antenna; and
   a controller that generates the control signal to change the presented impedance difference in response to the signal parameter, wherein the signal parameter is indicative of when the receiver is actively receiving signals and when the transmitter is actively transmitting signals, and the controller is configured to modify the control signal to reduce the presented impedance difference between the transmitter and the antenna when the transmitter is actively transmitting signals and the receiver is not actively receiving signals, and to modify the control signal to reduce the presented impedance difference between the antenna and the receiver when the transmitter is not actively transmitting signals and the receiver is actively receiving signals.

2. The impedance transformation circuit of claim 1, wherein the signal parameter is indicative of an amount of power reflected in the received signal.

3. The impedance transformation circuit of claim 2, wherein the controller modifies the control signal to cause the impedance adjusting circuit to reduce the presented impedance difference between the antenna and the receiver if the amount of reflected power does not satisfy a threshold value.

4. The impedance transformation circuit of claim 3, wherein the controller modifies the control signal to reduce the presented impedance difference between the antenna and the receiver to about 0.

5. The impedance transformation circuit of claim 2, wherein the signal parameter is indicative of a ratio of reflected power to non-reflected power of the received signal.

6. The impedance transformation circuit of claim 2, wherein the controller modifies the control signal to cause the impedance adjusting circuit to reduce the presented impedance difference between the transmitter and the antenna if the amount of reflected power satisfies a threshold value.

7. The impedance transformation circuit of claim 1, wherein the controller is configured to receive an indication of an amount of power reflected in the transmission signal and is operative to modify the control signal to change the presented impedance difference between the receiver and the antenna in response to the amount of reflected power in the transmission signal.

8. An impedance transformation circuit for use with a transmitter, a receiver, and an antenna, the transmitter providing a transmission signal for transmission by the antenna, the antenna providing a received signal having an associated signal parameter to the receiver, the impedance transformation circuit comprising:
   an impedance adjusting circuit between the antenna and receiver and transmitter, the impedance adjusting circuit being configured to change an impedance difference presented between at least one of: 1) the transmitter and the antenna, and 2) the antenna and the receiver, in response to a control signal; and
   a controller that generates the control signal to change the presented impedance difference in response to the signal parameter, wherein the signal parameter is indicative of a received signal strength of the received signal and the controller modifies the control signal to reduce the presented impedance difference between the transmitter and the antenna if the received signal strength satisfies a threshold value.

9. The impedance transformation circuit of claim 8, wherein the controller modifies the control signal to reduce the presented impedance difference between the antenna and the receiver if the received signal strength does not satisfy a threshold value.

10. An impedance transformation circuit for use with a transmitter, a receiver, and an antenna, the transmitter providing a transmission signal for transmission by the antenna, the antenna providing a received signal having an associated signal parameter to the receiver, the impedance transformation circuit comprising:
   an impedance adjusting circuit between the antenna and receiver and transmitter, the impedance adjusting circuit being configured to change an impedance difference presented between at least one of: 1) the transmitter and the antenna, and 2) the antenna and the receiver, in response to a control signal: and
   a controller that generates the control signal to change the presented impedance difference in response to the signal parameter, wherein the signal parameter is indicative of a bit error rate of the received signal and the controller modifies the control signal to reduce the presented impedance difference between the transmitter and the antenna if the bit error rate satisfies a threshold value.

11. The impedance transformation circuit of claim 10 wherein the controller modifies the control signal to reduce the presented impedance difference between the antenna and the receiver if the bit error rate does not satisfy a threshold value.

12. A method of operating an antenna tuner used with a transmitter, a receiver, and an antenna, the method comprising:
   sensing when the transmitter is actively providing signals to the antenna for transmission and when the receiver is actively receiving signals; and
   adjusting an impedance presented between at least one of: 1) the transmitter and the antenna, and 2) the antenna and the receiver, in response to the sensed parameter by reducing the presented impedance between the transmitter and the antenna when the transmitter is active and the receiver is not active and while the receiver is connected to the antenna, and reducing the presented impedance between the receiver and the antenna when the receiver is active and the transmitter is not active and while the transmitter is connected to the antenna.

13. The method of claim 12, further comprising sensing a signal parameter that is indicative of an amount of power reflected in a received signal provided by the antenna to the receiver.

14. The method of claim 13, wherein adjusting an impedance comprises reducing the presented impedance difference between the antenna and the receiver when the amount of reflected power does not satisfy a threshold value.

15. The method of claim 13, wherein the sensed signal parameter is indicative of a ratio of reflected power to non-reflected power.

16. The method of claim 13, wherein adjusting an impedance comprises reducing the presented impedance difference between the transmitter and the antenna when the amount of reflected power satisfies a threshold value.

17. The method of claim 12, further comprising sensing a signal parameter that is indicative of an amount of power reflected in a signal provided by the transmitter to the antenna for transmission, and wherein adjusting an impedance comprises changing the presented impedance difference between the receiver and the antenna in response to the amount of reflected power.

18. The method of claim 12, further comprising sensing a signal parameter that is indicative of when the receiver is actively receiving signals, wherein adjusting an impedance comprises reducing the presented impedance between the receiver and the antenna when the receiver is actively receiving signals.

19. The method of claim 12, further comprising sensing a signal parameter that is indicative of when the transmitter is actively providing signals to the antenna for transmission, wherein adjusting an impedance comprises reducing the presented impedance between the transmitter and the antenna when the transmitter is actively providing signals to the antenna for transmission.

20. A method of operating an antenna tuner used with a transmitter, a receiver, and an antenna, the method comprising:
   sensing a signal parameter associated with a received signal provided by the antenna to the receiver and that is indicative of a received signal strength of the received signal; and
   adjusting an impedance presented between at least one of: 1) the transmitter and the antenna, and 2) the antenna and the receiver, in response to the sensed parameter and comprising reducing the presented impedance difference between the transmitter and the antenna when the sensed parameter indicates that the received signal strength satisfies a threshold value.

21. The method of claim 20, wherein adjusting an impedance comprises reducing the presented impedance difference between the receiver and the antenna when the sensed parameter indicates that the received signal strength does not satisfy a threshold value.

22. A method of operating an antenna tuner used with a transmitter, a receiver, and an antenna, the method comprising:
   sensing a signal parameter associated with a received signal provided by the antenna to the receiver and that is indicative of a bit error rate of the received signal and
   adjusting an impedance presented between at least one of: 1) the transmitter and the antenna, and 2) the antenna and the receiver, in response to the sensed parameter and comprising reducing the presented impedance difference between the transmitter and the antenna when the sensed parameter indicates that the bit error rate satisfies a threshold value.

23. The method of claim 22, wherein adjusting an impedance comprises:
   reducing the presented impedance difference between the receiver and the antenna when the sensed parameter indicates that the bit error rate does not satisfy a threshold value.

* * * * *